(12) United States Patent
Albrecht

(10) Patent No.: US 7,821,268 B2
(45) Date of Patent: Oct. 26, 2010

(54) ELECTRONIC DEVICE FOR A MAGNETIC RESONANCE APPARATUS

(75) Inventor: Herbert Albrecht, Baunach (DE)

(73) Assignee: Siemens Aktiengesellschaft, Munich (DE)

( * ) Notice: Subject to any disclaimer, the term of this patent is extended or adjusted under 35 U.S.C. 154(b) by 132 days.

(21) Appl. No.: 12/339,336

(22) Filed: Dec. 19, 2008

(65) Prior Publication Data

US 2009/0160443 A1     Jun. 25, 2009

(30) Foreign Application Priority Data

Dec. 20, 2007   (DE) .................. 10 2007 061 593

(51) Int. Cl.
*G01V 3/00* (2006.01)
(52) U.S. Cl. ...................... 324/318; 324/322
(58) Field of Classification Search ......... 324/300–322; 62/181, 183, 186, 196.4, 259.2; 361/697; 123/3
See application file for complete search history.

(56) References Cited

U.S. PATENT DOCUMENTS

| | | | | |
|---|---|---|---|---|
| 5,285,347 A | * | 2/1994 | Fox et al. ..................... | 361/699 |
| 6,591,898 B1 | * | 7/2003 | Chu et al. .................. | 165/80.4 |
| 6,993,924 B2 | * | 2/2006 | Hsu et al. .................. | 62/238.6 |
| 7,191,605 B2 | * | 3/2007 | Hsu et al. ..................... | 62/117 |
| 2007/0106332 A1 | * | 5/2007 | Denker et al. .................. | 607/2 |
| 2007/0289324 A1 | * | 12/2007 | Suzuki et al. .............. | 62/259.2 |
| 2008/0245083 A1 | * | 10/2008 | Tutunoglu et al. ............ | 62/115 |

OTHER PUBLICATIONS

Patent Abstracts of Japan Publication No. 2007089830.

* cited by examiner

*Primary Examiner*—Brij B Shrivastav
(74) *Attorney, Agent, or Firm*—Schiff Hardin LLP

(57) ABSTRACT

An electronics device for a magnetic resonance apparatus has a housing in which one or more electronic components to be cooled are accommodated, with a flat cold distributor provided in the housing that can be supplied with an externally fed coolant, and that is associated with a blower to circulate the air inside the housing.

17 Claims, 3 Drawing Sheets

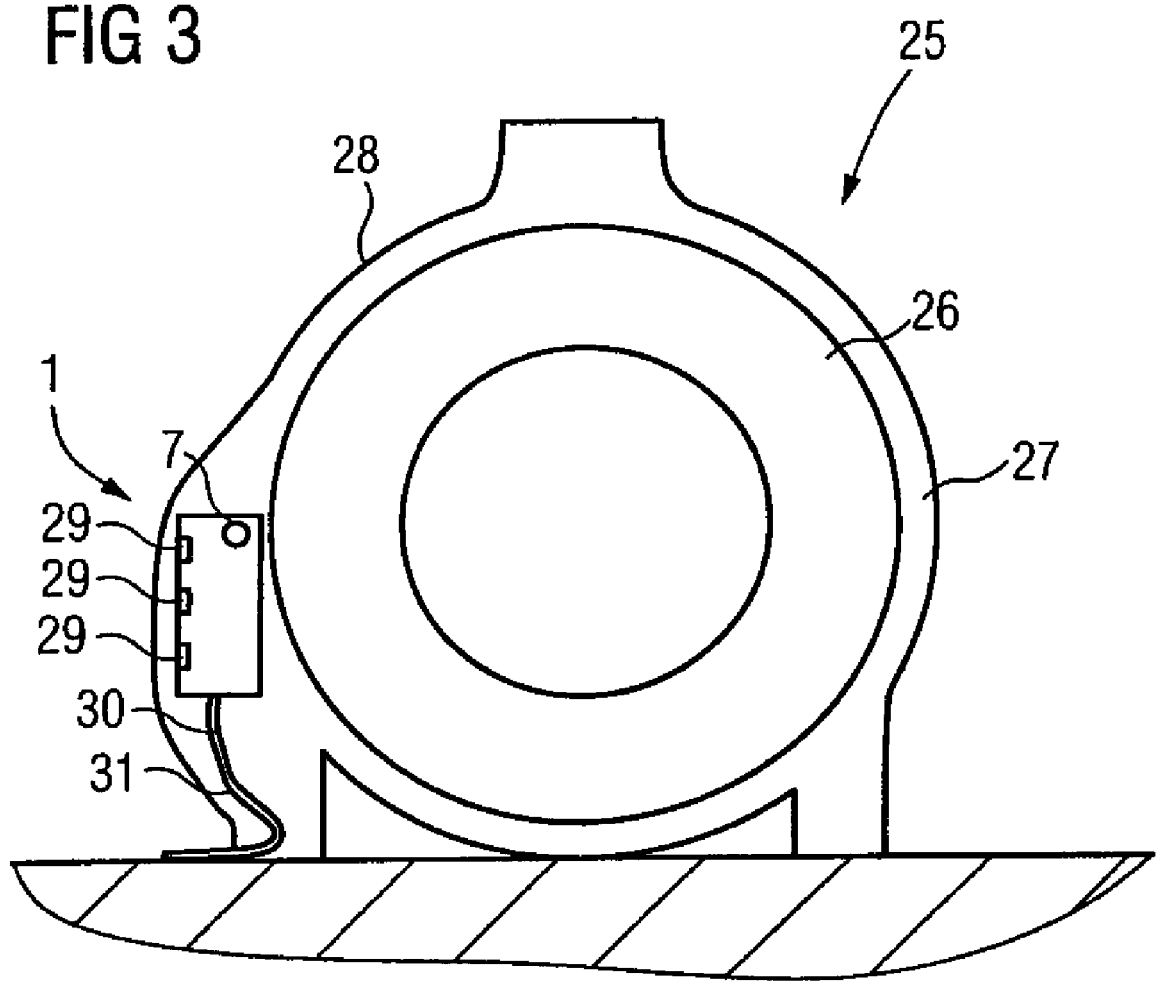

ELECTRONIC DEVICE FOR A MAGNETIC RESONANCE APPARATUS

BACKGROUND OF THE INVENTION

1. Field of the Invention

The invention concerns an electronics device for a magnetic resonance apparatus, of the type having a housing in which one or more electronic components to be cooled are accommodated.

2. Description of the Prior Art

For cost reasons, electronic components inside the RF shielding cabinet of magnetic resonance apparatuses are subject to an ever greater bundling into compact electronic devices or electronic units. Since a large portion of the contained functions pertain to the area in close proximity to the magnet, it is recommended to install these electronic devices directly in this region. For a compact design, an electronic device has a housing in which the required electronic components are arranged (frequently in modular configuration).

Because a power loss inevitably accumulates in the operation of the magnetic resonance apparatus or the electronics unit, a portion of which is emitted to the ambient atmosphere and consequently leads to heating, it is necessary to dissipate the accumulated heat. A pure convection cooling of the electronics device cooling or of the components contained therein serves for this purpose. The electronics device is typically arranged between the magnet and a casing wall. A number of ventilation slits that enable an air entrance in the region between the casing and the magnet are provided at the lower end of the casing for the convective cooling. The housing of the electronics device also has air entrance and exit openings so that an air flow can be drawn through the electronic device. The heated air escapes at the upper end, meaning that an air channel must be provided within the entire region from the lower air entrance in the region behind the casing up to the upper air exits. This inevitably also entails problems with regard to possible contamination because dust and other particles contained in the air can be drawn into the region between the magnet and the casing (as well as into the electronics device itself, naturally). Problems with water condensation can also occur in the housing during the refilling of the coolant cooling the superconducting magnet or upon a quench of the magnet.

SUMMARY OF THE INVENTION

An object of the present invention is to provide an electronics device that is improved relative to the items described above.

To solve this problem, in an electronics device of the aforementioned type, according to the invention a flat cold distributor that can be externally supplied with a coolant is provided in the housing, with a blower associated with the cold distributor to circulate the air inside the housing.

The electronics device according to the invention is characterized by a combined cooling effect achieved by cooling with a coolant cooling and cooling with air.

A flat cold distributor with a coolant intake connection and a coolant outflow connection that are directed to the outside of the housing and can be coupled with a corresponding coolant line is located inside the completely closed housing in the electronic device according to the invention. Coolant supplied from the outside, for example water, thus circulates through the cold distributor located inside the housing. Without any additional measures, this (advantageously rectangular) cold distributor is able to cool the entire interior the housing, i.e. it is designed sufficiently large with regard to the emission of thermal energy. A blower to circulate the air inside the housing is also provided. A continuous air circulation inside the housing is realized via this, meaning that a forced current is generated that leads to the situation that the heated air emitted by the electronic components in operation is moved and streams past the cold distributor, where it can be cooled so that an overheating does not occur.

According to the invention, a completely closed system is thus specified that enables an extremely efficient cooling without the problems described above.

The blower is preferably a blower that can be driven by the circulating coolant, preferably a cross-stream fan impeller. This means that a second function, namely that of the fan impeller actuation, is accorded to the coolant that is supplied from the outside and circulates through the cold distributor. The blower or the cross-stream fan impeller or the actuator thereof can be a miniature Francis turbine. After leaving the cold distributor, the coolant flows to the drive turbine of the fan impeller or the cross-stream blower, drives this, and is then discharged from the housing via a corresponding discharge line. This means that no electrical circulating blower is provided for the air circulation (although this would be possible) because, without additional measures, the possibility exists to design the housing from shielding material so that the stray field of the magnet does not disadvantageously affect the blower operation.

If a cross-stream fan impeller is used that advantageously consists of an electrically non-conductive material, and therefore the generation of induced eddy currents is avoided, this should essentially extend over the length of the cold distributor in order to provided for a large-volume air circulation.

In order to enable an optimally efficient cooling of the one or more electronic components located in the housing, in an embodiment of the invention at least one intake connection and at least one return connection are provided at the cold distributor, to which intake and return connections an electronic component having a coolant line can be connected by appropriate connectors. This means that the coolant supplied to the cold distributor flows into a connected electronic component, flows through the corresponding coolant line there and is directed back again into the cold distributor housing via the other connection. A significant component cooling thus occurs through the coolant output from the cold distributor and directed back again. Arbitrarily many connection pairs with intake and return can be provided in the flat cold distributor in order to be able to plug in arbitrarily many in the event of a modular design of the electronic components. Because the design of a magnetic resonance apparatus is known in principle, the entirety of the electronics can be integrated into the housing in component form and be optimally cooled in this way.

The connections themselves are self-sealing connections, thus hydraulic in-line quick couplings that enable an electronic component to be connected and withdrawn again without a coolant leak occurring either on the side of the cold distributor or on the side of the electronics component.

As an alternative to cooling an electronic component by intake of the coolant into the electronic component itself, in another embodiment according to the invention an attachment mechanism (in particular plug-lock elements) is provided at the cold distributor for attachment of an electronic component in thermal contact with the cold distributor. In this embodiment of the invention, the coolant circulates only in the cold distributor with which, however, every electronic component is coupled by an optimally large-surface thermal contact. Heat accumulating on the part of the electronic component is discharged into the cold distributor and there is dissipated by the coolant. For this purpose, it is merely necessary to provide suitable attachment means (advantageously simple plug-lock connections) via which an electronic component can be brought into good thermal contact with the cold distributor in a simple manner. Such an attachment mechanism can naturally also be provided in the previously described embodiment with the component-specific intake and outflow connections for the coolant; but the connections themselves can also serve as attachment means.

A contact plate to which modular electronic components can be connected, and via which the contact connection between plugged-in electronic components ensues, is advantageously also provided at the cold distributor. This contact plate thus forms the electrical cross-connections between the individual electronic components which respectively are accorded specific functions typical to magnetic resonance. The entirety of the communication, the electrical power supply and all required electrical connections thus ensue via it. If a pure contact cooling of the electronic components (thus no circulation of the coolant fluid through the component modules themselves) is used, the cross-connection contact plate should be dimensioned such that a sufficiently large contact surface remains free at the cold distributor. The contact surface should exhibit a sufficiently large minimum size that should not exceed approximately 50×30 mm, for instance, because a high thermal load can be transferred. Cooling rails that are thermally coupled with the components to be cooled (such as power semiconductors etc.) and that are contacted with the cold distributor are advantageously provided at the electronic components. The contact plate also has a corresponding number of multi-pin plugs for contacting the electronic components. Finally, possible tolerances can be reduced by the direct mounting of the contact plate on the cold distributor.

In a development of the invention, at least one flow direction device that serves for the homogenization of the air flow can be provided in the housing. It should be ensured that the air circulated by the blower homogeneously and uniformly reaches all integrated electronic components, such that no dead spaces occur at which possible heat build-ups can result. The flow homogenization device serves for this purpose. This device preferably has two housing sides arranged opposite one another, in particular an upper perforated plate and a lower perforated plate between which the electronic components are arranged. A flow homogenization can be achieved via these perforated plates that are perforated with a number of openings. The arrangement of the openings (thus the perforation pattern) and their diameter are appropriately determined under consideration of the existing flow resistances and pressure ratios.

In order to be able to cool the circulated air as optimally as possible, at least one cooling body past which the air circulating inside the housing flows is arranged at the cold distributor. A ribbed cooling body is advantageously used; however, any cooling body is suitable that exhibits an optimally large surface along which the air to be cooled can stream so that an optimally efficient heat transfer is realized.

In addition to the electronics device, the invention also concerns a magnetic resonance apparatus embodying at least one such electronics device.

The electronics device itself is preferably arranged such that connections provided at the electronic component or components are arranged on the side facing away from the magnet. This means that the connections at which peripheral apparatuses or other secondary equipment are to be connected are located on the side facing toward the casing, which either has a corresponding access opening to these connections, or is locally removable in a simple manner so that a simple contacting is possible.

It is particularly appropriate when the electronics device is connected in a coolant loop at the apparatus. This means that a fluid cooling (typically water cooling) that is normally provided anyway is also used for cooling the electronic unit, such that no separate coolant loop must be provided for this purpose.

BRIEF DESCRIPTION OF THE DRAWINGS

FIG. 3 shows the basic components of a magnetic resonance apparatus according to the invention, with an electronics device according to the invention.

DESCRIPTION OF THE PREFERRED EMBODIMENTS

Figure 1:
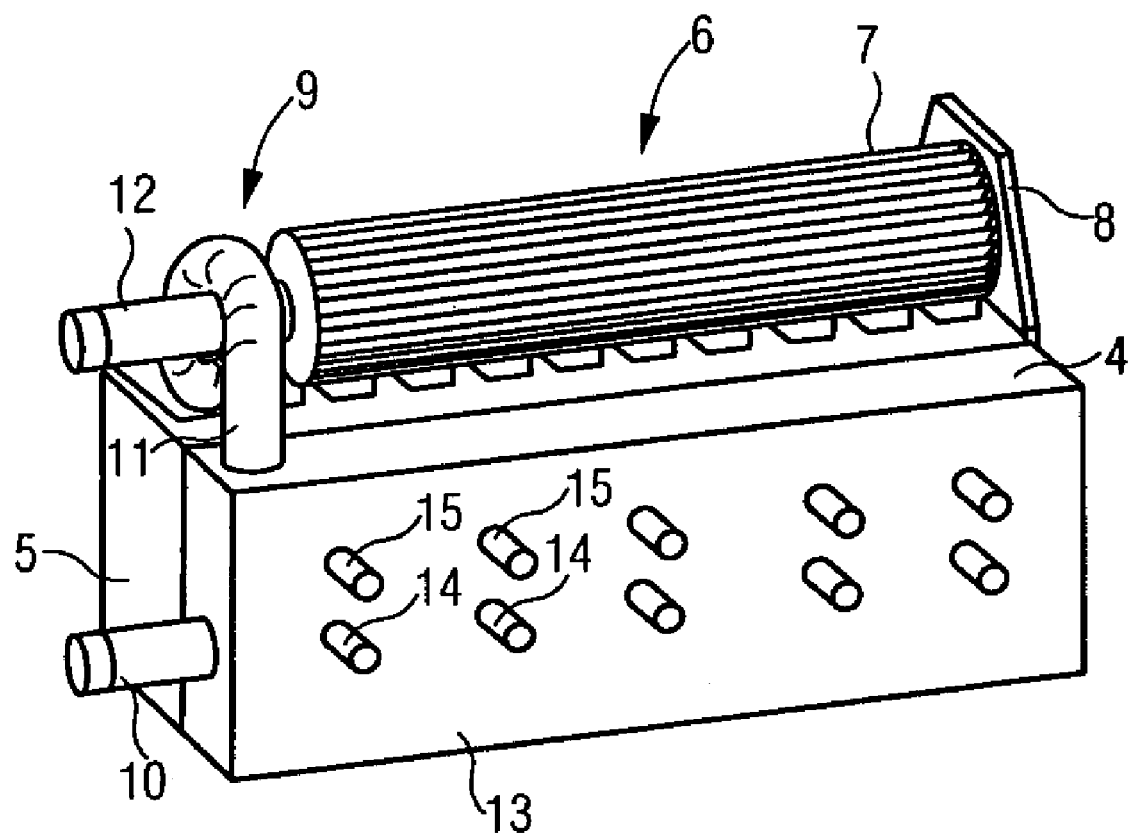
FIG. 1 is a perspective view of a cooling unit of an electronics device according to the invention, without a surrounding housing.
Figure 2:
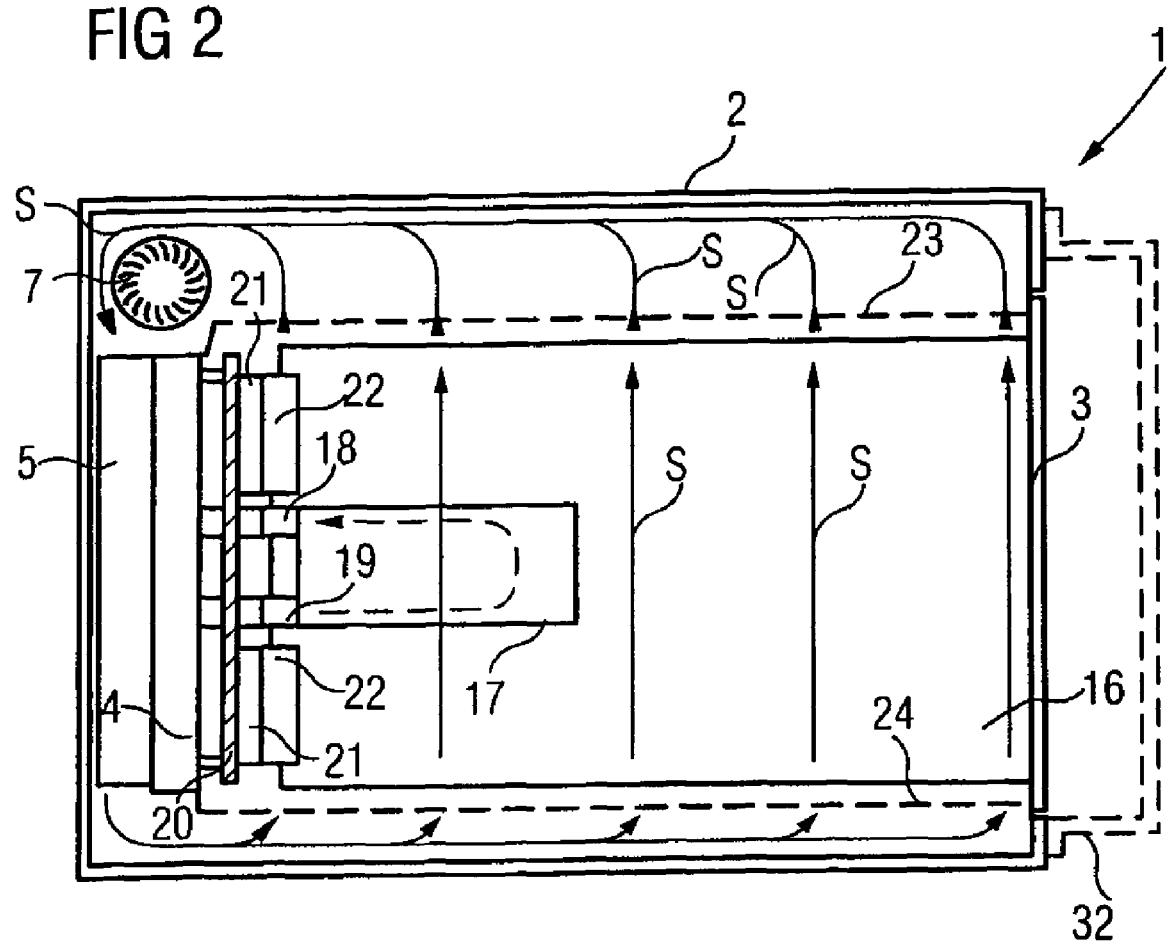
FIG. 2 is a view of the electronics device of FIG. 1 with the housing opened at the side.

FIGS. 1 and 2 show an electronics device 1 according to the invention and its cooling unit (FIG. 1). The device 1 has a housing 2 that is closed on all sides. A housing seal is produced at its front side via the front plates of the integrated electronic components 16 (which is discussed further in the following) that are sealed from one another and from the surrounding housing. Corresponding dummy panels via which the sealing from the other front plates or the housing is produced are used at slots in the housing, which slots are possibly not populated with an electronic component 16. A flat, planar cold distributor 4 that is essentially cuboid (see FIG. 1) is located inside the housing. A cooling body 5 (advantageously a ribbed cooling body) is attached on its back side, advantageously is bolted on or flange-mounted. A blower 6 (here in the form of a cross-stream fan impeller 7) that is swivel-mounted on one side via a bearing flange 8, on the other side in the region of a drive turbine 9 (which is discussed further in the following) is located on the top side of the cold distributor 4.

A coolant intake connection 10 that opens at the housing side (not shown in detail) and to which a coolant feed line (for example part of the water cooling loop of the magnetic resonance apparatus) can be connected is provided at the cold distributor 4. The coolant (for example water) flows into the inside of the cold distributor 4 and is directed there via suitable coolant lines (not shown in detail). It exits at an exit line 11 and flows to the drive turbine 9 (for example Francis turbine) via which the actuation of the cross-stream fan impeller 7 (which, like the turbine, advantageously consists of an electrically non-conductive material) is produced. The fed coolant exits the drive turbine 9 via a discharge connection 12 that is in turn directed to the outside of the housing. A siphon line is connected to this discharge connection 12. By the use of such a fluid-driven turbine, the cooling unit or the electronic unit can also be used in apparatuses with strong stationary magnetic fields.

In the shown example, multiple pairs of intake connections 14 and return connections 15 are provided on the front side 13 of the cold distributor 4. Individual electronic components 16 (here in the form of individual, flat, possibly even self-contained modules) can be connected to these. For this, in particular in electronic components with high power loss, each electronic component 16 (see FIG. 2) possesses a coolant section 17 at which two corresponding connections 18, 19 are provided that can be connected with the respective connections 14 and 15. The connections 14 and 15, and 18 and 19, are preferably hydraulic in-line quick couplings that are self-sealing so that no coolant can escape upon plugging in and removing an electronic component module 16. The supplied coolant circulates in the coolant segment 17 (as is represented by the dashed arrow shown there) and flows back again to the discharge connection 15, where it enters the cold distributor 4 again and then flows to the drive turbine.

As FIG. 1 shows, here five pairs of connections 14, 15 are provided. The system is clearly arbitrarily expandable, meaning that the cold distributor 4 can also be executed longer so that even more electronic components 16 can be plugged in. Overall it is thus possible to accommodate and to cool the entire electronic in a common housing 2. The cross-stream fan impeller 7 should preferably extend significantly over the length of the cold distributor 4.

As FIG. 2 shows, a contact plate 20 that serves for cross-wiring of the individual plugged-in electronic components 16 is also arranged at the cold distributor 4. Corresponding contact plugs 21 into which corresponding mating contact plugs 22 of an electronic component are inserted when this is positioned are arranged on the contact plate. This means that the plugging into the coolant connections 14, 15 and the connection of the plug contacts 21, 22 ensues simultaneously. The individual electronic components 16 communicate among one another via the corresponding cross-wiring (not shown in detail here) of the contact plate 20; the power supply of the components also hereby ensues, and the necessary electrical connections are provided. This means that the position at which an electronic component is to be plugged in is predetermined.

As FIG. 2 also shows, a device is provided for homogenization of the air flow, comprising two perforated plates 23, 24, wherein the perforated plate 23 is arranged in the upper housing region and the perforated plate 24 is arranged in the lower housing region. Corresponding flow arrows S are drawn in FIG. 2 that show the air flow that is enforced by the cross-stream fan impeller 7. This is clearly relatively homogeneous because the flow is made uniform via the perforated plates 23, 24. The air flow enters from below via the perforated plate 24 between the individual electronic modules (which exhibit a certain separation from one another) and is drawn upwards. It thereby takes the heat emitted by the electronic components 16 with it. As is indicated by the flow arrow S, the cross-stream fan impeller 7 draws the heated air downward into the region of the ribbed cooling body 5 that is in thermal contact with the cold distributor 4, thus is cooled by this. It extracts the heat again from the warm air (thus cools it) so that cooled air exits at the lower end of the ribbed cooling body and streams below the perforated plate 24 again, from which it is again drawn into the region of the electronic components 16.

Both a closed fluid cooling loop and a closed air cooling loop are thus clearly provided here. The housing 2 possesses no external ventilation openings; only the two connections 10 and 12 for intake and discharge of the cold water are provided. The air circulation ensues entirely within the housing, thus within a closed air volume; the ribbed cooling body enables a very good heat dissipation because it is thermally coupled with the cold distributor 4. Also, no other electronic components that serve to drive the blower are provided in the housing, apart from the electronic components 16 (possibly encapsulated via suitable shielded housing). Rather, the cooled water that is introduced anyway is advantageously used for this. To avoid eddy currents that could possibly brake the impeller rotation, the cross-stream fan impeller 7 itself is advantageously made from an electrically non-conductive material so that it cannot interact with the magnetic field.

FIG. 3 shows a basic representation of a magnetic resonance apparatus 25 according to the invention (of which here only the magnet unit but not further peripheral apparatuses such as controller, image processing etc. are shown) comprising the magnet 26 that is covered by casing elements 27, 28. An electronics device 1 according to the invention is arranged on the left side in the shown example. For orientation purposes, only the fan impeller 7 is shown, which is arranged on the back side directed towards the magnet. Located on the opposite side are diverse connections 29 that are provided at the ends there of the individual electronic components 16 (which are not shown in detail here). Corresponding peripheral apparatuses that are activated or controlled via the electronic components 16 are connected to these connections 29. The front plates of the electronic components 16 are provided with integrated connections 29 (plugs) and outwardly sealed so that the housing 2 is completely sealed from the outside in spite of the accessibility of the connection means 29 (a casing part of the casing element 28 that is detachable in the region of the connection meals is to be removed for this).

Also shown are a coolant intake line 30 and a coolant discharge line 31 that are connected at the connections 10 or, respectively, 12 of the electronic device 1. These lines 30, 31 are part of a coolant loop that serves to cool other components of the magnetic resonance apparatus 25, meaning that the electronic device is integrated into this loop that is provided anyway.

Overall, as a result of the completely closed housing without any ventilation opening, the electronic device according to the invention offers a high level of security against the penetration of possible condensed water accumulating at the magnet, and a high shielding attenuation between the inside and the outside of the housing is also possible, such that the required EMV properties can be fulfilled. As a result of the bundling of a number of electronic components 16, the necessary space requirement can also be optimized; furthermore, the casing of the magnet can be optimized because no air channels that would enable a convection cooling are to be provided, which is likewise cost-optimizing. Also, no electrical cooling blower is used; rather, the flowing coolant that is supplied anyway is used to drive the blower, such that no sensitivity to high static magnetic fields is present because of this. High power losses can also be dissipated due to the forced ventilation via the cross-stream fan impeller 7 in connection with the water cooling.

It should be noted that, instead of the coupling of an electronic component to water-supplying intakes and discharges 14, 15 that is shown in FIGS. 1 and 2, a purely thermal coupling between an electronic module 16 and the cold distributor 4 is possible. In this case, for example, corresponding attachment means onto which the electronic components 16 are plugged or with which they are connected would be provided instead of the connections 14, 15. A large-area thermal contact between the respective electronic module 16 and the front side 13 of the cold distributor 4 is hereby ensured, via which the active cooling of the thermally coupled electronic component ensues. In this case the cooled water would only be circulated in the cold distributor 4 and directed to the drive turbine 9. This thus avoids the provision of corresponding hydraulic in-line quick couplings, both on the part of the cold distributor 4 and the respective electronic components 16; an efficient cooling is hereby likewise possible. It is also conceivable (in particular for EMV reasons) to close the housing on its entire back side not via the sealed arranged front plates 3 of the electronic modules 16 but rather via a separate sealing cover that is to be opened as needed. This can also be additionally provided for sealing over the front plates 3 for EMV reasons. Such a sealing cover 32 is shown in dashed lines in FIG. 2 as an example.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
   a magnetic resonance data acquisition device comprising a basic field magnet, and
   an electronics device comprising a housing and containing at least one electronic component connected to said magnetic resonance data acquisition device that participates in the operation of said magnetic resonance data acquisition device, said housing further containing a flat cold distributor having an input supplied with an externally fed coolant, and a blower that circulates air inside said housing over said flat cold distributor.

2. A magnetic resonance apparatus as claimed in claim 1 comprising a connector that electrically connects said at least one electronic component to a further component in said magnetic resonance acquisition device, said connector being disclosed at a side of said electronics device facing away from said basic field magnet.

3. A magnetic resonance apparatus as claimed in claim 1 wherein said magnetic resonance data acquisition device comprises a coolant loop in which coolant circulates, and wherein said coolant loop is connected to said flat cold distributor to supply said externally fed coolant thereto.

4. An electronics device for a magnetic resonance apparatus comprising:
   a housing containing at least one electronic component to be cooled;
   a flat cold distributor in said housing, having an input that is accessible externally of said housing to receive external fed coolant; and
   a blower located in said housing that blows air that interacts with said flat cold distributor to circulate air inside said housing.

5. An electronics device as claimed in claim 4 wherein said coolant circulates in said housing and wherein said blower is driven by the circulating coolant.

6. An electronics device as claimed in claim 4 wherein said blower is a cross-stream fan impeller.

7. An electronics device as claimed in claim 6 wherein said blower is located directly on said flat cold distributor.

8. An electronics device as claimed in claim 6 wherein said blower consists of electrically non-conductive material.

9. An electronics device as claimed in claim 6 wherein said blower extends over a length of said flat cold distributor.

10. An electronics device as claimed in claim 4 wherein said externally accessible input of said flat cold distributor forms an intake connection, and wherein said flat cold distributor also has a return connection that is accessible externally of said housing, and wherein said electronics device further comprises a coolant line connected to said intake connection and said return connection.

11. An electronics device as claimed in claim 10 wherein each of said intake connection and said return connection is a self-sealing connection.

12. An electronics device as claimed in claim 4 comprising a fastening element carried by said flat cold distributor that fastens said at least one electronic component in thermal contact with said cold distributor.

13. An electronics device as claimed in claim 4 comprising a plurality of electronic components, and a contact plate on which at least some of said electronic components are mounted as a module, and wherein said cold distributor has at least one fastening element that fastens said contact plate in thermal contact with said flat cold distributor at a side of said contact plate facing away from said electronic components forming said module.

14. An electronics device as claimed in claim 4 comprising a flow director in said housing that substantially homogenizes air flow in said housing produced by said blower.

15. An electronics device as claimed in claim 14 wherein said flow director comprises two perforated plates respectively disposed at opposite sides of said housing, and wherein said flat cold distributor and said at least one electronic component are located between said two perforated plates.

16. An electronics device as claimed in claim 4 comprising a cooling body located at said flat cold distributor, said blower directing circulating air over said cooling body.

17. An electronics device as claimed in claim 16 wherein said cooling body is a ribbed cooling body.

* * * * *